(12) United States Patent
Matsushima

(10) Patent No.: US 9,401,477 B2
(45) Date of Patent: Jul. 26, 2016

(54) ORGANIC EL PANEL AND METHOD FOR MANUFACTURING SAME

(75) Inventor: Hideaki Matsushima, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/375,558

(22) PCT Filed: Feb. 10, 2012

(86) PCT No.: PCT/JP2012/000926
§ 371 (c)(1),
(2), (4) Date: Jul. 30, 2014

(87) PCT Pub. No.: WO2013/118196
PCT Pub. Date: Aug. 15, 2013

(65) Prior Publication Data
US 2015/0053948 A1  Feb. 26, 2015

(51) Int. Cl.
*H01L 51/00* (2006.01)
*H01L 51/56* (2006.01)
*H01L 27/32* (2006.01)

(52) U.S. Cl.
CPC ........ *H01L 51/0004* (2013.01); *H01L 27/3211* (2013.01); *H01L 27/3218* (2013.01); *H01L 27/3246* (2013.01); *H01L 51/56* (2013.01)

(58) Field of Classification Search
CPC .......... H01L 51/00; H01L 51/56; H01L 27/32
USPC ............................................ 257/40; 313/504
See application file for complete search history.

(56) References Cited

U.S. PATENT DOCUMENTS

| | | | |
|---|---|---|---|
| 5,294,869 A | 3/1994 | Tang et al. | |
| 5,443,922 A | 8/1995 | Nishizaki et al. | |
| 5,688,551 A | 11/1997 | Littman et al. | |
| 7,443,093 B2 * | 10/2008 | Jianpu et al. | 313/500 |

(Continued)

FOREIGN PATENT DOCUMENTS

| | | |
|---|---|---|
| CN | 1784103 | 6/2006 |
| JP | 05-163488 | 6/1993 |

(Continued)

OTHER PUBLICATIONS

International Search Report (ISR) in International Patent Application No. PCT/JP2012/000926, dated May 1, 2012.

(Continued)

*Primary Examiner* — Sheng Zhu
(74) *Attorney, Agent, or Firm* — Greenblum & Bernstein, P.L.C.

(57) ABSTRACT

An organic EL panel including an organic light-emitting layer with a miniaturized structure formed by a wet process, allowing for excellent light-emitting characteristics, and a method for manufacturing the same. Specifically, the display panel includes: a substrate; first electrodes arranged above the substrate along a first and second direction intersecting with each other; a first, second, and third organic light-emitting layer arranged above the first electrodes so as to be adjacent to each other in the second direction, and each containing an organic light-emitting material corresponding to a different emission color; a first bank separating the first and the second layer; a second bank separating the second and the third layer; and a second electrode disposed above the first, the second, and the third layer and being different in polarity from the first electrodes. The first and the second bank are different in width along the second direction.

10 Claims, 10 Drawing Sheets

(56) References Cited

U.S. PATENT DOCUMENTS

| | | |
|---|---|---|
| 8,536,589 B2 | 9/2013 | Matsushima |
| 8,546,820 B2 | 10/2013 | Matsushima |
| 8,546,821 B2 | 10/2013 | Matsushima |
| 8,604,492 B2 | 12/2013 | Matsushima |
| 8,604,493 B2 | 12/2013 | Matsushima |
| 8,604,494 B2 | 12/2013 | Matsushima |
| 8,604,495 B2 | 12/2013 | Matsushima |
| 2006/0017375 A1 | 1/2006 | Noguchi et al. |
| 2006/0113897 A1 | 6/2006 | Fukase |
| 2007/0085472 A1* | 4/2007 | Yamakawa et al. ........... 313/504 |
| 2010/0171415 A1 | 7/2010 | Akamatsu et al. |
| 2012/0080694 A1 | 4/2012 | Yoshida et al. |
| 2013/0105782 A1 | 5/2013 | Matsushima |
| 2013/0126839 A1 | 5/2013 | Matsushima |
| 2014/0097421 A1 | 4/2014 | Yoshida et al. |

FOREIGN PATENT DOCUMENTS

| | | |
|---|---|---|
| JP | 3369615 | 10/1993 |
| JP | 3789991 | 6/1997 |
| JP | 2006-059796 | 3/2006 |
| JP | 2006-244828 | 9/2006 |
| JP | 2010-092595 | 4/2010 |
| JP | 2011-044380 | 3/2011 |
| JP | 2011-086389 | 4/2011 |
| WO | 2010/143360 | 12/2010 |

OTHER PUBLICATIONS

Office Action from The Patent Office of the People's Republic of China (SIPO) in Chinese Patent Application No. 201280068998.8, dated Nov. 30, 2015, together with a partial English language translation.

* cited by examiner

ORGANIC EL PANEL AND METHOD FOR MANUFACTURING SAME

TECHNICAL FIELD

The present invention relates to an organic EL panel and a manufacturing method for the same, and in particular to a method for proper formation of an organic light-emitting layer by a wet process.

BACKGROUND ART

In recent years, progress has been made in research and development of diverse functional devices which involve use of an organic semiconductor.

One typical example of such functional devices is an organic EL device. The organic EL element, which is a current-driven light-emitting element, includes a pair of electrodes, i.e. an anode and a cathode, and a functional layer layered between the pair of electrodes, the functional layer containing an organic material. The functional layer includes layers such as an organic light-emitting layer and a buffer layer. Further, there are cases where a hole injection layer is disposed between the functional layer and the anode. The hole injection layer is disposed for injecting holes to the functional layer. To drive the organic EL element, voltage is applied across the pair of electrodes to use the phenomenon of electroluminescence that occurs when holes injected from the anode into the functional layer recombine with electrons injected from the cathode into the functional layer. Given the high visibility of organic EL elements resulting from their self-luminescence, as well as their excellent shock resistance resulting from the solid-state structure thereof, more attention is now being given to the application of organic EL elements as a light emitter for various display devices or as a light source.

Organic EL elements can be largely divided into two types, according to the material used for forming the functional layer therein. The first type of organic EL elements is a vapor deposition type. A vapor deposition-type organic EL element has a functional layer that is mainly composed of low molecular material and that is formed as a film by applying a vacuum process such as a vapor deposition method. The second type of organic EL elements is an application type. In an application-type organic EL element, ink containing organic high molecular material or organic low molecular material having excellent thin film forming characteristics is applied, dried and formed into a film by a wet process such as an inkjet method and a gravure printing method.

Now, attempts are being made to realize large-sized organic EL panels by using application-type organic EL elements. As mentioned above, in application-type organic EL elements, the functional layer is formed by applying ink containing prescribed materials. When a wet process is adopted, the precision with which the application of functional layer material of the respective colors to corresponding positions on the substrate is performed is not influenced by the size of the substrate. Hence, the technical barrier to be overcome in realizing the manufacturing of large organic EL panels is relatively low.

CITATION LIST

Patent Literature

[Patent Literature 1] Japanese Patent No. 3369615
[Patent Literature 2] Japanese Patent No.3789991

SUMMARY OF INVENTION

Technical Problem

Recently, in the technical field of displays, displays have been becoming more high-definition, and there have been demands for miniaturization of sub pixels of organic EL panels as well.

However, if sub pixels of an organic EL panel are miniaturized, it would be difficult to apply a different color to each section of the organic light-emitting layer by a wet process. The reasons for this are described with reference to FIG. 11.

FIG. 11 is a cross-sectional view illustrating a stage in a manufacturing process of a conventional organic EL panel. In this figure, an anode and a hole-injection layer 104 are formed on the surface of a substrate 101, and banks 105c having a fixed width ($D_1$) is formed at fixed intervals ($S_2$). The figure also shows that droplets 1060R, 1060G and 1060B of ink containing organic light-emitting material (hereinafter simply referred to as ink) have just been applied to the light-emitting areas between every two adjacent banks 105C (each corresponding to the fixed interval $S_2$).

Since sufficient amounts of ink drops 1060R, 1060G and 1060B are dripped, each ink droplet immediately after the application protrudes upward from the space between the adjacent banks 105C. Therefore, when the intervals $L_1$ and $L_2$ (having a same value in this example) between the adjacent ink droplets 1060R, 1060G and 1060B are not large enough, the ink droplets 1060R, 1060G and 1060B having different colors would be mixed, and causes an application failure. This problem becomes more noticeable for a smaller sub pixel (in terms of the size of a sub pixel including the banks 105C and the light-emitting areas).

The present invention is made in view of the above-described problem, and aims to provide an organic EL panel and a method for manufacturing the same that allow for proper formation of an organic light-emitting layer by a wet process and excellent light-emitting characteristics even when the organic EL panel is miniaturized.

Solution to Problem

To achieve the aim, one aspect of the present invention provides an organic EL panel comprising: a substrate; a plurality of first electrodes arranged above the substrate along a first direction and a second direction intersecting with each other; a first organic light-emitting layer, a second organic light-emitting layer and a third organic light-emitting layer arranged above the plurality of first electrodes so as to be adjacent to each other in the second direction, and each containing an organic light-emitting material corresponding to a different emission color; a first bank separating the first organic light-emitting layer and the second organic light-emitting layer from each other; a second bank separating the second organic light-emitting layer and the third organic light-emitting layer from each other; and a second electrode disposed above the first organic light-emitting layer, the second organic light-emitting layer and the third organic light-emitting layer, and being different in polarity from the plurality of first electrodes, wherein the first bank and the second bank are different in width along the second direction.

Advantageous Effects of Invention

In an organic EL panel pertaining to one aspect of the present invention, the banks separating the first organic light-emitting layer, the second organic light-emitting layer and the third organic light-emitting layer have different widths. The banks defining the light-emitting areas where ink color mixture is likely to occur are configured to have a wider width than other banks. This configuration effectively prevents different colors of ink applied to adjacent light-emitting areas from mixing with each other. As a result, this configuration allows for proper formation of the organic light-emitting layers, and achieves an organic EL panel with excellent light-emitting characteristics.

DESCRIPTION OF EMBODIMENTS

Figure 1:
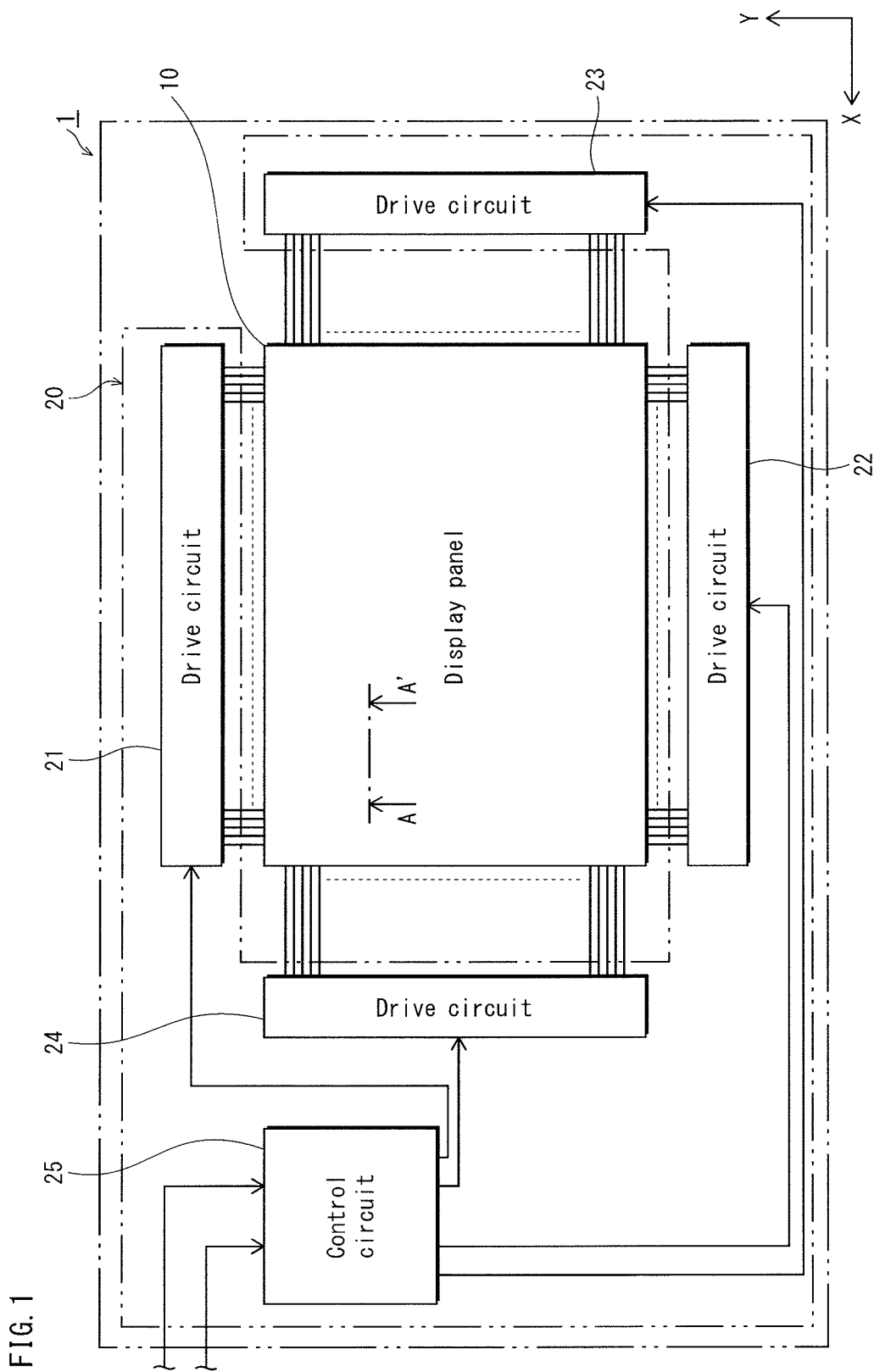
FIG. 1 is a block diagram illustrating an overall configuration of an organic EL apparatus 1 pertaining to Embodiment.

<Outline of an Aspect of the Present Invention>

One aspect of the present invention provides an organic EL panel comprising: a substrate; a plurality of first electrodes arranged above the substrate along a first direction and a second direction intersecting with each other; a first organic light-emitting layer, a second organic light-emitting layer and a third organic light-emitting layer arranged above the plurality of first electrodes so as to be adjacent to each other in the second direction, and each containing an organic light-emitting material corresponding to a different emission color; a first bank separating the first organic light-emitting layer and the second organic light-emitting layer from each other; a second bank separating the second organic light-emitting layer and the third organic light-emitting layer from each other; and a second electrode disposed above the first organic light-emitting layer, the second organic light-emitting layer and the third organic light-emitting layer, and being different in polarity from the plurality of first electrodes, wherein the first bank and the second bank are different in width along the second direction.

The first organic light-emitting layer, the second organic light-emitting layer and the third organic light-emitting layer may be the same in width along the second direction.

Each of the first organic light-emitting layer, the second organic light-emitting layer and the third organic light-emitting layer may be a dried coating of ink containing an organic light-emitting material, the ink for the first organic light-emitting layer may have a lower density than the ink for the second organic light-emitting layer and the ink for the third organic light-emitting layer, and the first bank may be greater than the second bank in width along the second direction.

Each of the first organic light-emitting layer, the second organic light-emitting layer and the third organic light-emitting layer may be a dried coating of ink containing an organic light-emitting material, the ink for the second organic light-emitting layer may have a higher density than the ink for the first organic light-emitting layer and the ink for the third organic light-emitting layer, and the first bank may be greater than the second bank in width along the second direction.

The first organic light-emitting layer may be a red light-emitting layer.

A third bank separating first electrodes arranged along the first direction from each other.

Another aspect of the present invention provides an organic EL panel comprising: a substrate; a plurality of first electrodes arranged above the substrate along a first direction and a second direction intersecting with each other; a first organic light-emitting layer, a second organic light-emitting layer and a third organic light-emitting layer arranged above the plurality of first electrodes so as to be adjacent to each other in the second direction, and each containing an organic light-emitting material corresponding to a different emission color; a first bank separating the first organic light-emitting layer and the second organic light-emitting layer from each other, and a second bank separating the second organic light-emitting layer and the third organic light-emitting layer from each other; and a second electrode disposed above the first organic light-emitting layer, the second organic light-emitting layer and the third organic light-emitting layer, and being different in polarity from the plurality of first electrodes, wherein within a given area, the first bank and the second bank are different in width along the second direction.

Another aspect of the present invention provides a method for manufacturing an organic EL panel, comprising: preparing a substrate; forming a plurality of first electrodes above the substrate along a first direction and a second direction intersecting with each other; forming a first organic light-emitting layer, a second organic light-emitting layer and a third organic light-emitting layer above the plurality of first electrodes so as to be adjacent to each other in the second direction, each of the first organic light-emitting layer, the second organic light-emitting layer and the third organic light-emitting layer containing an organic light-emitting material corresponding to a different emission color; forming a first bank separating the first organic light-emitting layer and the second organic light-emitting layer from each other, and a second bank separating the second organic light-emitting layer and the third organic light-emitting layer from each other; and forming a second electrode above the first organic light-emitting layer, the second organic light-emitting layer and the third organic light-emitting layer, the second electrode being different in polarity from the plurality of first electrodes, wherein the first bank and the second bank are formed to be different in width along the second direction.

Each of the first organic light-emitting layer, the second organic light-emitting layer and the third organic light-emitting layer may be formed by applying ink containing an organic light-emitting material above the plurality of first electrodes, and drying the ink.

The first bank may be formed to be greater than the second bank in width along the second direction, and the ink for the first organic light-emitting layer may have a lower density than ink for the second organic light-emitting layer and the ink for the third organic light-emitting layer.

The first bank may be formed to be greater than the second bank in width along the second direction, and the ink for the second organic light-emitting layer may have a higher density than the ink for the first organic light-emitting layer and the ink for the third organic light-emitting layer.

The following explains embodiments of the present invention with reference to the drawings.

<Embodiment 1>

FIG. 1 is a block diagram illustrating an overall configuration of an organic EL apparatus 1 pertaining to Embodiment 1.

(Organic EL Apparatus 1)

The organic EL apparatus 1 includes a display panel 10 and a drive controller 20 connected thereto.

The display panel 10 is an organic EL panel having a plurality of organic EL elements aligned along the X direction and the Y direction intersecting with each other (at right angles in this example), and thus the organic EL elements are arranged in a matrix.

The drive controller 20 includes four drive circuits 21 through 24 and a control circuit 25, for example. The number of the drive circuits may be other than four.

Figure 2:
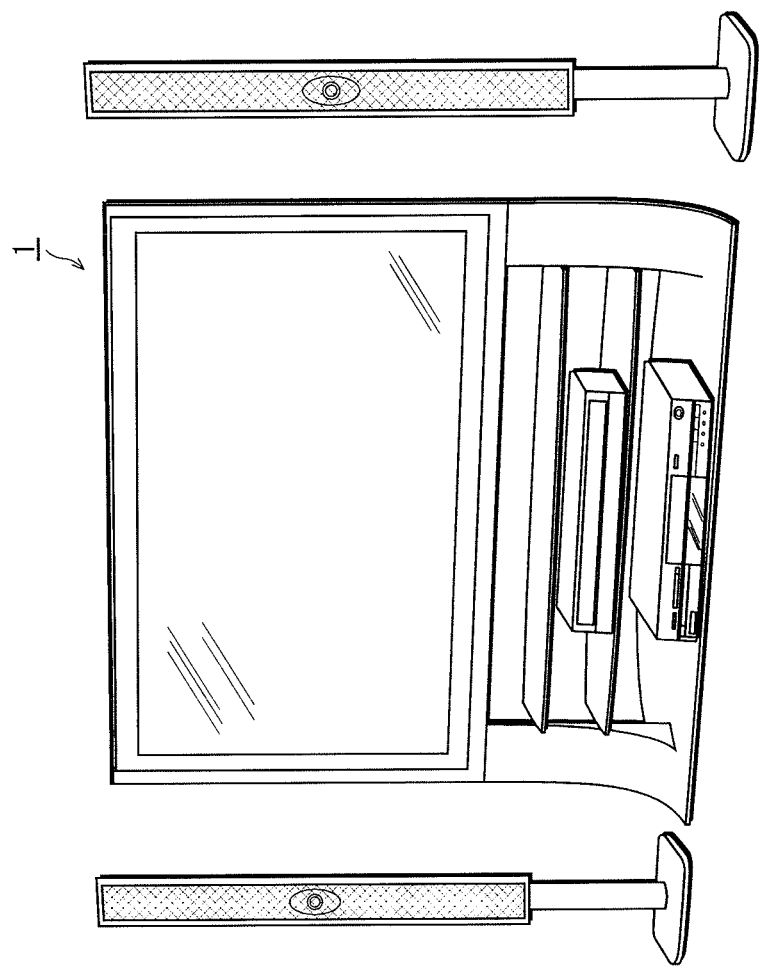
FIG. 2 is an external perspective view illustrating an example of the appearance of a set that includes the organic EL apparatus 1.

The organic EL apparatus 1 serves as, for example, a part of TV system, the appearance of which is as shown in FIG. 2. Unlike LCDs, the organic EL apparatus 1 can be thin because it does not require a backlight, and is advantageous in terms of system designing.

(Configuration of Display Panel 10)

Figure 3:
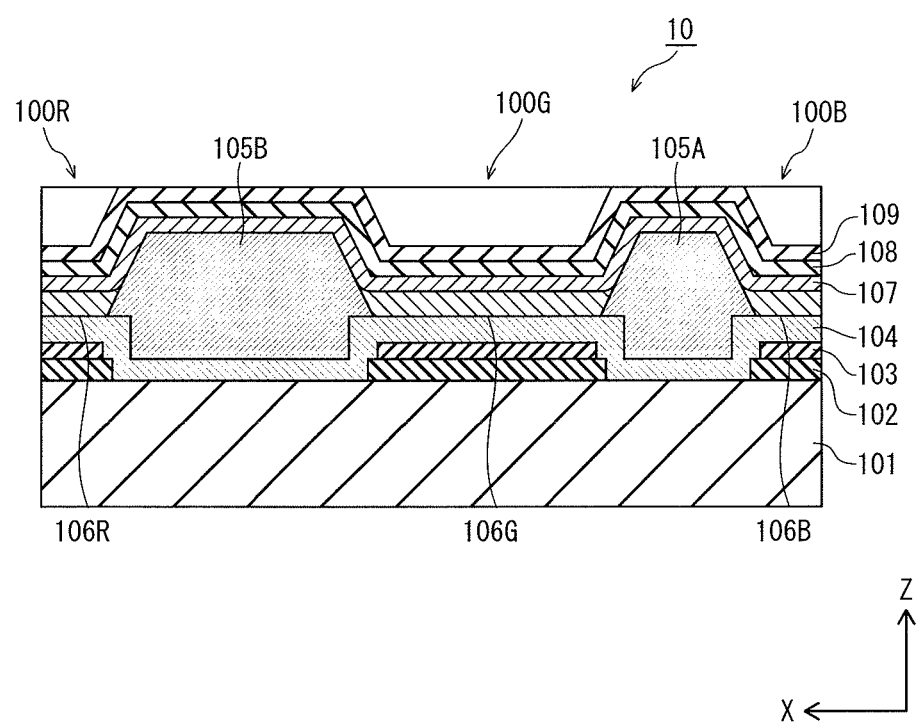
FIG. 3 is a schematic cross-sectional view illustrating the configuration of an organic EL element 100G in a display panel 10.

FIG. 3 is a schematic partial cross-sectional view illustrating the basic configuration of an organic EL element in a display panel 10. This figure shows (a part of) the display panel 10 viewed in the direction indicated by the arrows A and A' in FIG. 1.

The display panel 10 is of a top-emission type, for example. An organic EL element 100R that emits red (R) light, an organic EL element 100G that emits green (G) light, and an organic EL element 100B that emits blue (B) light are repeatedly arranged in this order along the opposite direction as the X direction. Each organic EL element is disposed in one of light-emitting areas separated by banks 105A and 105B. In the display panel 10, each of the elements 100R, 100G and 100B constitutes a light-emitting area as a sub pixel, and each group of adjacent three organic EL elements 100R, 100G and 100B constitutes a pixel.

From among these organic EL elements, FIG. 3 shows a configuration around the organic EL element 100G that emits green (G) light.

In each of the light-emitting areas of the display panel 10, an anode 102, an electrode coating layer 103 and a hole injection transport layer 104 are layered in this order on the upper surface of a TFT substrate 101 (hereinafter simply referred to as "substrate 101"). An organic light-emitting layer 106R (a first organic light-emitting layer), an organic light-emitting layer 106G (a second organic light-emitting layer), or an organic light-emitting layer 106B (a third organic light-emitting layer) is formed on the hole injection layer 104, and an electron injection layer 107, a cathode 108, and a passivation layer 109 are sequentially formed on each organic light-emitting layer.

Among these, the anode 102, the electrode coating layer 103 and the organic light-emitting layers 106R, 106G and 106B are each partitioned into sections, and each section corresponds to the organic EL element 100R, 100G or 100B. In contrast, the hole-injection layer 104, the electron injection layer 107, the cathode 108, and the passivation layer 109 are formed across the substrate 101.

The following explains each of the constituent elements.

(Substrate 101)

The substrate 101 serves as a base member of the display panel 10, and is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, or alumina.

While not shown in the figures, TFTs (thin film transistors) are provided on the surface of the substrate 101 for driving the organic EL elements 100R, 100G and 100B.

(Anode 102)

The anode (first electrode) 102 is composed of a single layer or of a laminate of a plurality of layers of a conductive material. The anode 102 is formed with Ag (silver), APC (alloy of silver, palladium, and copper), ARA (alloy of silver, rubidium, and gold), MoCr (alloy of molybdenum and chromium), NiCr (alloy of nickel and chromium), or the like. When the display panel 10 is of the top-emission type, it is desirable that the anode 102 be made of highly reflective material.

(Electrode Coating Layer 103)

The electrode coating layer 103 is made of ITO (indium tin oxide) for example, and is disposed to cover the upper surface of the anode 102.

(Hole Injection Transport layer 104)

The hole injection transport layer 104 is a layer of an oxide of metal such as silver (Ag), molybdenum (Mo), chromium (Cr), vanadium (V), tungsten (W), nickel (Ni) or iridium (Ir). A hole injection transport layer 104 formed from such a metal oxide has the function of assisting with hole generation and of injecting and transporting holes stably into each of the organic light-emitting layers 106R, 106G and 106B. The hole injection transport layer 104 has a high work function.

When the hole injection transport layer 104 is made of an oxide of a transition metal, a plurality of energy levels can be occupied since transition metal has a plurality of oxidation numbers. This makes hole injection easy and allows for reduction of driving voltage.

Note that in addition to forming the hole injection transport layer 104 with the above-described metal oxides, PEDOT (an amalgam of polythiophene and polystyrene sulfonic acid) or the like may also be used.

(Banks 105A, 105B)

A plurality of banks including a bank 105A (a first bank) and a bank 105B (a second bank) are formed on the surface of the hole injection layer 104 above the substrate 101 such that each bank has a line structure with a predetermined trapezoidal cross-section. As shown in the panel frontal view in FIG. 4, the banks 105A and 105B are disposed to separate the organic EL elements 100R, 100G and 100B with different luminescent colors arranged along the X direction and bus bar areas 100X from each other. Each of the banks 105A and 105B is configured as a line bank arranged in parallel with the Y direction, and thus the banks 105A and 105B form a stripe pattern.

The material of the banks 105A and 105B is not limited to any particular material. However, it is desirable that the banks 105A and 105B be made of an organic material with insulating properties (such as acrylic resin, polyimide resin, or novolac-type phenolic resin). Since the banks 105A and 105B are etched and baked when formed, it is desirable that the banks 105A and 105B be made of a material that has a high resistance and is unlikely to change in shape or quality during the processing. To provide the bank 105A and 105B with water repellency, the side walls can be fluoridated.

The banks 105A and 10B may have a multilayer structure including two or more layers instead of the single-layer structure shown in FIG. 3. If this is the case, the banks 105A and 105B may be formed by laminating organic material layers, inorganic material layers, or a combination of organic and inorganic material layers.

Figure 8:
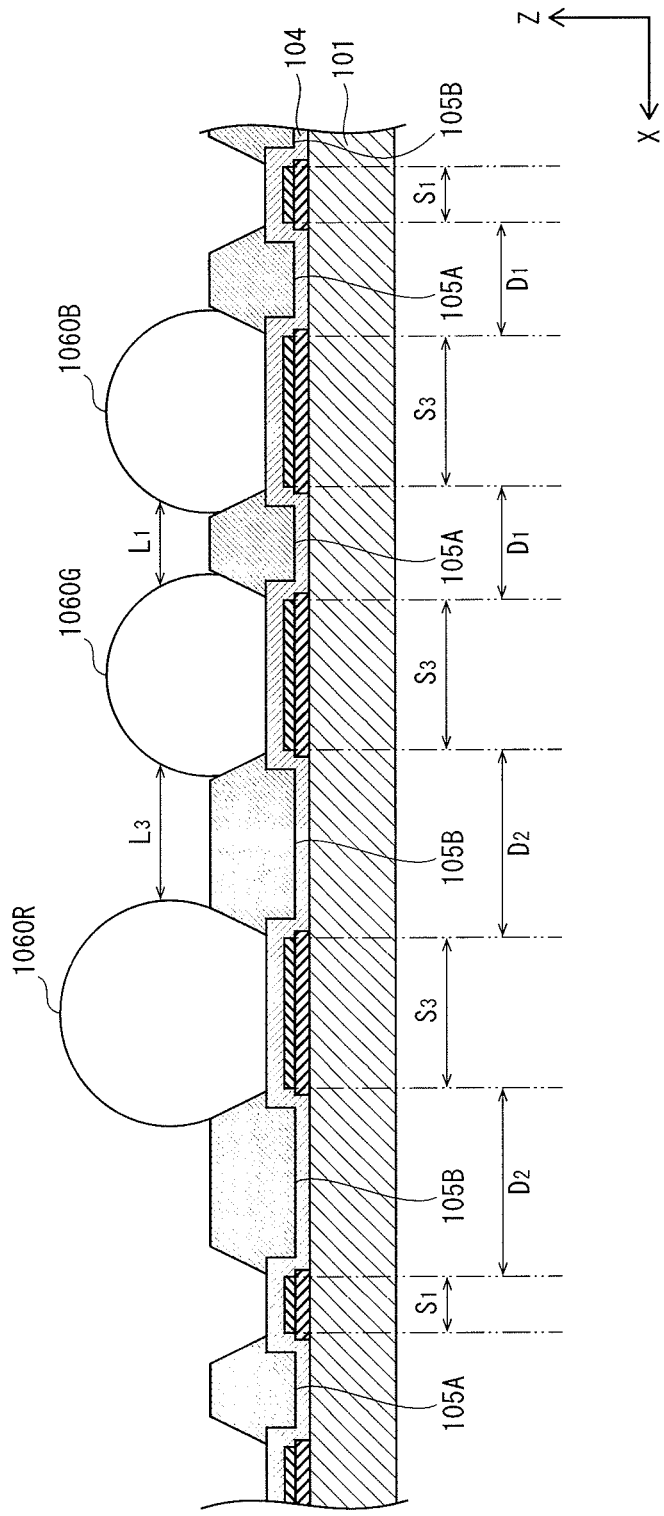
FIG. 8 is a cross-sectional view illustrating a stage in a manufacturing process of the display panel 10 (immediately after application of ink).

As shown in the cross-sectional view (manufacturing process diagram) in FIG. 8, the banks corresponding to the organic EL elements 100R, 1000 and 100B are arranged at fixed intervals ($S_3$) in the X direction. In contrast, width $D_2$ of the banks 105B defining the organic EL element 100R is greater than width $D_1$ of the banks 105A defining the organic EL elements 1000 and 100B and the bus bar areas 100X.

In this example, the width in the X direction of the light-emitting areas, which is equal to $S_3$, is set at a fixed value by positioning the banks 105A and 105B. However, the width may be varied for each luminescent color.

In addition, it is not essential that the banks 105A and 105B have a trapezoidal cross section, and the banks 105A and 105B may have a rectangular solid shape.

In the display panel 10, the "width" of each bank is intended to indicate the length of the bottom side of the cross section, which corresponds to $D_1$ or $D_2$.

(Organic Light-Emitting Layers 106R, 106G, 106B)

Each of the organic light-emitting layers 106R, 106G and 106B has a function to emit light when an excitation state is produced by the recombination of holes injected through the anode 102 with electrons injected through the cathode 108. The organic light-emitting layer 106 is made of a light-emitting organic material that can be formed by a wet process.

Specifically, examples of the light-emitting organic material include an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488.

In the display panel 10, the "width" of each of the organic light-emitting layers 106R, 106G and 106B and the light-emitting areas is intended to indicate the width in the X direction.

(Electron Injection Layer 107)

The electron transport layer 107 has a function to transport electrons, which are injected from the cathode 108, to the organic light-emitting layers 106R, 106G and 106B. It is desirable that the electron transport layer be made of, for example, barium, phthalocyanine, lithium fluoride, or a combination thereof.

(Cathode 108)

The cathode (the second electrode) 108 may be made of, for example, ITO or IZO (indium zinc oxide). When the display panel 10 is a top-emission type, it is desirable that the cathode 108 be made of a light-transmissive material. It is desirable that the light-transmission rate be 80% or greater.

In addition, the cathode 108 may have a laminate structure having a layer that includes an alkali metal, an alkali earth metal, or a halide thereof, and a layer that includes silver, which are layered in this order. The layer that includes silver may be made of silver alone, or from a silver alloy. Also, in order to increase light extraction efficiency, a highly-transparent refraction index adjustment layer may be provided above the layer that includes silver.

(Passivation Layer 109)

The passivation layer 109 has a function to control the organic light-emitting layers 106 or other layers from being exposed to water or air, and is made of, for example, silicon nitride (SiN), or silicon oxynitride (SiON). When the display panel 10 is of the top-emission type, it is desirable that the cathode 108 be made of a light-transmissive material.

(Bus bar Areas 100X)

Figure 4:
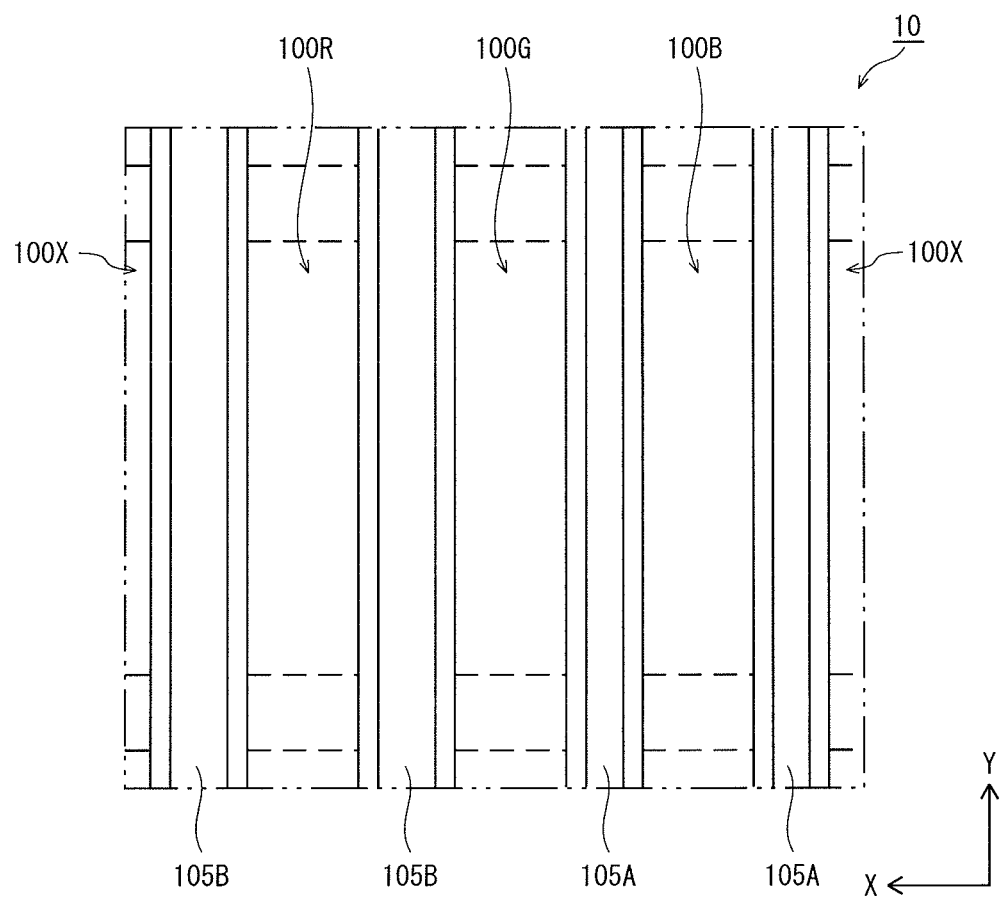
FIG. 4 is a partial frontal view illustrating the locations of organic EL elements 100R, 100G and 100B in a display panel 10 having a line bank structure.
Figure 9:
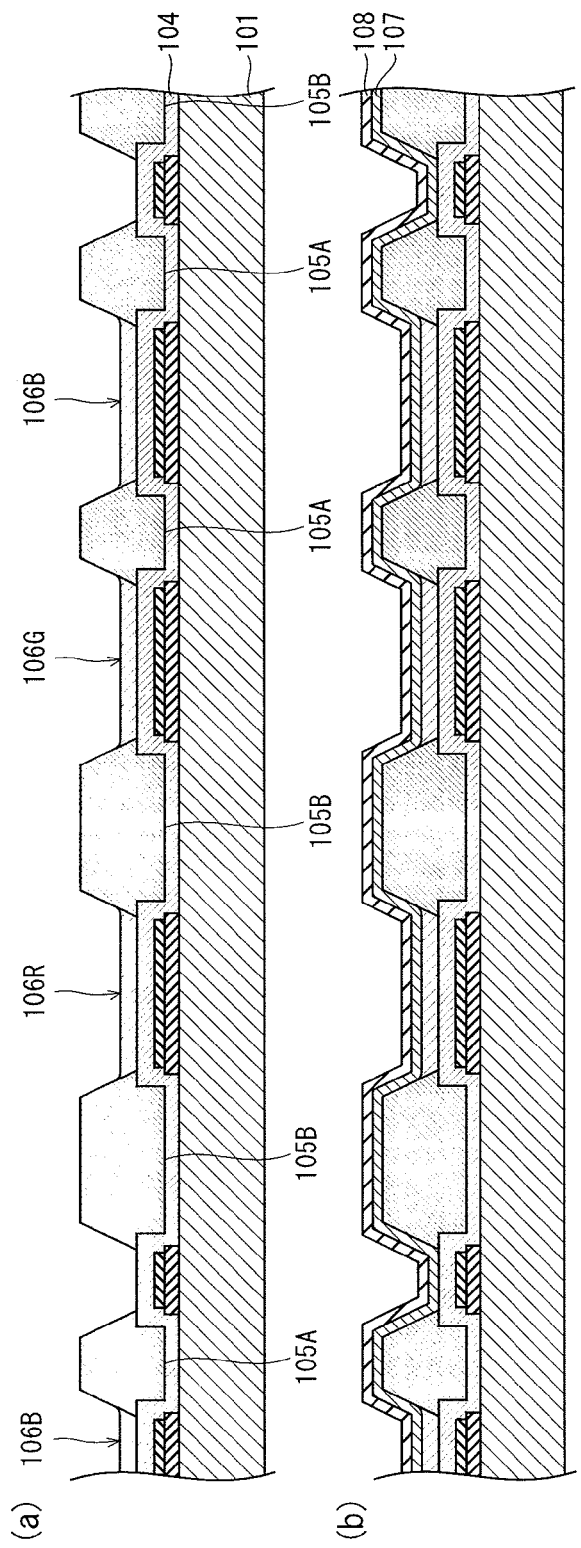
FIGS. 9(a)-(c) is a cross-sectional views illustrating stages in a manufacturing process of the display panel 10.

As shown in FIG. 4 and section (c) of FIG. 9, a bus bar area 100X is provided between the element 100B and the element 100R. The bus bar area 100X ensures the conductivity of the cathode 108 between the banks 105A and 105B across the display panel 10. The cathode 108 is electrically connected to a bus bar (an auxiliary electrode 102B) via an electrode coating layer 103B.

The bus bar area 100X may be provided at any positions. For example, the bus bar area X may be provided one for every element, or one for several elements or one for several tens of elements along the X direction.

(Functions and Advantageous Effects of Provision of Banks 105A and 105B)

From among the banks in the display panel 10 having the stated configuration, by which the organic EL elements 100R, 100G and 100B with different luminescent colors arranged along the X direction are separated from each other, some of the banks are different from the rest in width along the X direction. Therefore, in the display panel 10, the organic EL elements 100R, 100G and 100B and the bus bar areas 100X are same or greater in aperture ratio than conventional panels, and at the same time, the organic light-emitting layers 106R, 106G and 106B have a desirable film thickness (design film thickness). As described above, the display panel 10 is designed with consideration of margins with respect to the entire panel, and ensures both a desirable aperture ratio and a desirable film thickness of the organic light-emitting layers.

In the display panel 10, the ink for forming the organic light-emitting layer 106R has a lower density than the ink for forming the organic light-emitting layer 106G and the ink for forming the organic light-emitting layer 106B. Therefore, the two banks 105B, which define the organic EL element 100R, are set to be twice greater in width along the X direction than the banks 105A, which define the organic EL elements 100G and 100B ($D_2=2D_1$). Accordingly, during the manufacturing of the panel, the ink interval $L_3$ between the ink droplet 1060R and the ink droplet 1060G is significantly wider than the ink interval $L_1$ as shown in FIG. 8. On the other hand, the width of the banks 105A defining the organic light-emitting layers 106G and 106B can be set equal to or smaller than the width of conventional banks, and hence the intervals in the X direction between the sub pixels are not increased.

Consequently, the stated configuration prevents contact between the ink droplets 1060R and 1060G even when sufficient amounts of ink droplets corresponding to the respective luminescent colors are applied in order to form organic light-emitting layers having a desired design thickness. Thus, each of the organic light-emitting layers 106R, 106G and 106B can be formed appropriately.

The organic light-emitting layers 106R, 106G and 106B with desirable film thicknesses corresponding to their respective colors are formed. Therefore, when driven, the organic light-emitting layers 106R, 106G and 106B in the display panel 10 are expected to exhibit preferable light-emitting characteristics.

Furthermore, while securing a sufficient thickness for the organic light-emitting layers 106R, 106G and 106B, only the banks 105B are increased in width. Therefore, increase in the intervals between the sub pixels along the X direction across the display panel 10 is limited, and a desirable aperture ratio is ensured for each of the organic EL elements 100R, 100G and 100B and the bus bar areas 100X.

As described above, the display panel 10 ensures both proper formation of the organic light-emitting layers 106R, 106G and 106B and desirable aperture ratios of the organic EL elements 100R, 100G and 100B and the bus bar areas 100X. The display panel 10 is designed with consideration of margins with respect to the entire panel. Thus, a high-definition organic EL panel can be produced.

In addition, only some of the banks are increased in width, and the banks that define the light-emitting areas with a smaller risk of color mixture can be formed to have a small width. Therefore, the stated configuration more effective prevents decrease in aperture ratio of the light-emitting areas on the organic EL panel than when all the banks have a wide width. The width along the X direction of the light-emitting areas adjacent to each other can be set freely. Therefore, it is possible to maintain the light-emitting characteristics at the same level as a conventional configuration, or conversely, to widen the light-emitting areas. Thus, the stated configuration allows for improved flexibility in designing.

Basically, the configuration of the organic EL panel 1 as described above can be obtained by arranging the banks 105A and 105B in an appropriate pattern. Therefore, the configuration allows for manufacturing of high-definition organic EL panels at lows cost and high efficiency, and is eminently practical.

(The Relationship between Properties of Ink and Width of Banks)

Figure 5:
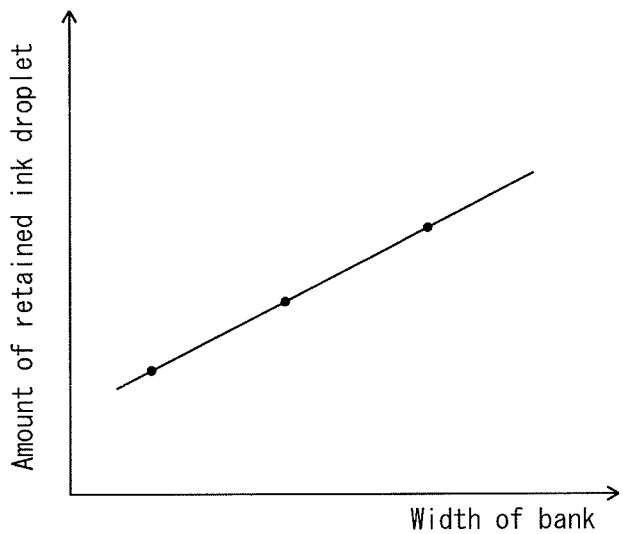
FIG. 5 is a graph illustrating the relationship between the amount of a retained ink droplet retained by banks and the width of the banks.

FIG. 5 shows the relationship between the amount of retained ink (i.e. the amount of a retained ink droplet) between adjacent banks of a common organic EL panel and the width of the banks.

As shown in the graph illustrated in the figure, the amount of retained ink (i.e. the amount of a retained ink droplet) between the adjacent banks is proportional to the width of the banks.

When the size of the display panel is fixed, if the width of the banks is increased, the amount of retained ink increases accordingly. However, the light-emitting areas become smaller accordingly. Conversely, if the width of the banks is reduced, the amount of retained ink decreases. When the width of the banks is small, a margin for printing is limited. If this is the case, however, the aperture ratios of the light-emitting areas and the bus bar areas are expected to be high, and the light-emitting characteristics are accordingly expected to be excellent, even when the sub pixels are miniaturized. Furthermore, a high conductivity between the auxiliary electrode 102B and the cathode can be expected.

As described above, the width of the banks and the margin for printing are in a trade-off situation.

Figure 6:
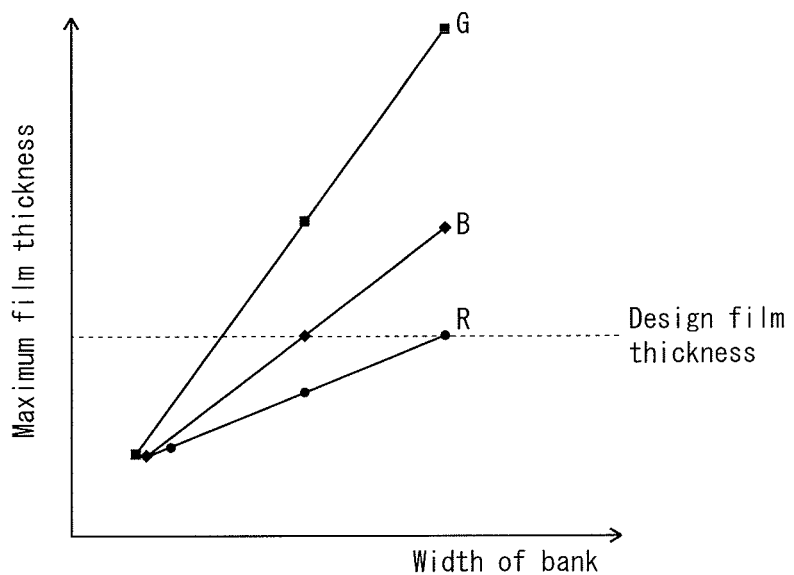
FIG. 6 is a graph illustrating, for each of the banks corresponding to RGB colors, the relationship between the maximum film thickness of an organic light-emitting layer between the banks and the width of the banks.

Furthermore, as shown in FIG. 6, the inks for forming the organic light-emitting layers corresponding to the different luminescent colors are different from each other in properties such as viscosity and density. Generally, the density of the R color ink is the lowest, the density of the G color ink is the next lowest, and the density of the B color ink is the highest among these colors. Accordingly, when forming the organic light-emitting layers having the respective desired design thicknesses, the R color ink is most likely to cause color mixture, next the G color ink, and then the B color ink.

In this way, the physical properties of ink and the desired film thickness are different for each color. Therefore, there is a problem that it is difficult to optimize the designing with consideration of margins with respect to the entire panel.

Generally, film thickness $EML_d$ of an organic light-emitting layer formed by a wet process satisfies the following relationship (Math. 1):

$$EML_d = C_i \times N_d \qquad \text{[Math. 1]}$$

$C_i$ denotes the density of ink (solid content concentration) and $N_d$ denotes the number of ink droplets.

The viscosity $V_i$ of ink satisfies the following relationship (Math. 2):

$$V_i = C_i \times Mw \qquad \text{[Math. 2]}$$

Mw denotes the mean molecular weight of ink.

Practically, the viscosity $V_i$ of ink is determined by the specifications of the ink head of the device used for application of ink. The mean molecular weight Mw of ink is determined by the material of the ink. Therefore, if the material of the ink is changed, the mean molecular weight of the material changes, and accordingly, the straight lines shown in FIG. 6, which represent the properties of the inks respectively corresponding to the luminescent colors, might change in inclination in some cases.

It is therefore desirable that the widths of the banks pertaining to the present invention are determined based on the properties of the inks, considering the relationships provided above. The actual data shown in FIG. 6 represents the properties of commonly-used conventional RGB inks, and the properties might change depending on the materials and the density of each ink. Therefore, it is desired to appropriately determine the width of the banks 105B based on, for example, the properties such as viscosity and the amount of droplets of the ink to be actually used, considering the relationships provided above.

For example, when a first ink, a second ink and a third ink are different from each other in properties as with inks corresponding to R, G and B colors and these inks are applied so as to be adjacent to one another in this order, the following information is helpful.

(A) When the first ink has a lower density than the second ink and the third ink, it is desirable that the banks for holding the first ink are greater in width than the other banks. According to (A), the ink that is most likely to overflow can be appropriately held by the banks, which leads to proper formation of each organic light-emitting layer.

(B) When the second ink has a higher density than the first ink and the third ink, it is desirable that the first banks are greater than the second bank in width. According to (B), it is possible to reduce the width of the banks 105A to be the minimum while securing the required width of the banks 105B, which ensures or improves the aperture ratios of the light-emitting areas in total. Therefore, such a configuration is advantageous in arranging the miniaturized sub pixels.

For example, when the display panel 10 is a 40 inch display with a 4K2K resolution, the intervals in the X direction between the organic EL elements 100R, 100G and 100B is set to 231 μm. Furthermore, in order to maintain the aperture ratios of the light-emitting areas and the aperture ratios of the bus bar areas 100X at the same level as conventional panels, the width in the X direction of the banks 105A and 105B needs to be set to approximately 15 μm to 30 μm. When the relationship shown in FIG. 6 is satisfied with respect to the width of the banks required for the desired thicknesses of the organic light-emitting layers under the limitations of the physical properties of each of the R, G and B color inks, $D_1$ is set to 30 μm and $D_2$ is set to 15 μm, for example. As a consequence, the organic light-emitting layers of the R, G and B colors can be formed with desirable film thicknesses, and at the same time, the aperture ratios of the light-emitting areas and the bus bar areas 100X can be maintained.

Figure 7:
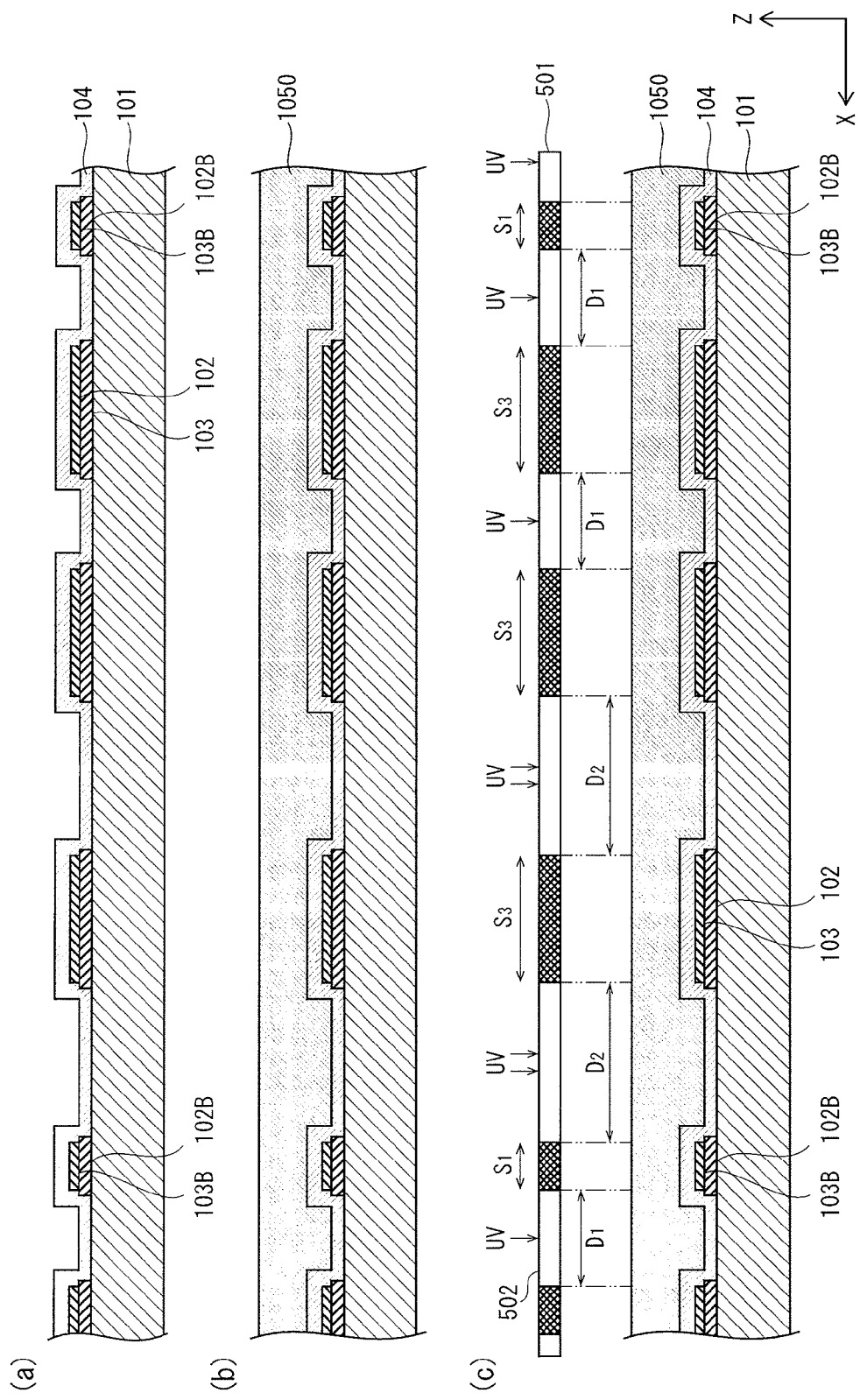
FIGS. 7(a)-(c) is a cross-sectional views illustrating stages in a manufacturing process of the display panel 10.

The following illustrates an example method for manufacturing the display panel 10 with reference to FIGS. 7 through 9.

(Method for Manufacturing Display Panel 10)

The following explains an example method for manufacturing the display panel 10 pertaining to the present embodiment.

Note that various conventional processes may be applied to the manufacturing processes not explained below.

First, as shown in section (a) of FIG. 7, a substrate 101 is prepared. Then, the anodes 102 and the electrode coating layers 103 are sequentially layered on the areas on the upper surface, with respect to the X axis direction, of the substrate 101, where the organic EL elements 100R, 100B and 100G and the bus bar areas 100X are to be formed.

Subsequently, the hole injection transport layer 104 is layered to cover the entire surface of the substrate 101 including the electrode coating layer 103.

The anodes 102 are formed, for example, by first forming a thin Ag film via the sputtering method or vacuum deposition method and then patterning the thin Ag film via photolithography.

The electrode coating layers 103 are formed, for example, by forming a thin ITO film on the surface of the anodes 102 using a method such as the sputtering method and then patterning the thin ITO film via a method such as photolithography.

To form the hole injection transport layer 104, first a metal film is formed on the surface of the substrate 101, including the surface of the electrode coating layer 103, via a method such as the sputtering method. After that, the metal film is oxidized.

Next, as shown in section (b) of FIG. 7, the spin coat method, for example, is used to form a bank material layer 1050 so as to cover the top of the hole injection transport layer 104. A photoresist material is used for forming the bank material layer 1050. For example, an organic material having insulating properties such as ultraviolet curable resin may be used. Specifically, acrylic resin, polyimide resin, novolac-type phenolic resin may be used.

Next, as shown in section (c) of FIG. 7, a mask 501 is placed above the bank material layer 1050, the mask 501 having openings 502 at the locations for forming the banks. Here, the widths of the apertures 502 are set to $D_1$ or $D_2$, which are the widths of the banks, and the widths along the X direction of the mask are set to $S_1$ or $S_3$, which correspond to the intervals along the X direction between the banks 105A and 105B to be formed (i.e. the widths along the X direction of the light-emitting areas and the bus bar areas).

Under such conditions, exposure process is performed by ultraviolet (UV) irradiation via the openings 502 of the mask 501. Then, the banks 105A and 105B are formed by performing a predetermined developing process and a baking process.

When inorganic material is used for forming the banks 105A and 105B, the bank material layer 1050 can be formed by a paint-on method in the same manner as the case of using organic material. The patterning of the inorganic material is performed by a photo-etching method using a predetermined etchant (e.g. a solution of tetramethylammonium hydroxide (TMAH)).

Subsequently, as shown in FIG. 8, the ink droplets 1060R, 1060G and 1060B are dripped into the gaps between the adjacent banks 105A and 105B by, for example, an inkjet method.

At this point, in order to form organic light-emitting layers having desired film thicknesses, it is necessary to apply sufficient amounts of the ink droplets 1060R, 1060G and 1060B such that the surfaces of the droplets will be higher than the banks 105A and 105B. According to Embodiment 1, the banks 105B are greater in width than the banks 105A. Therefore, the interval $L_3$ between the ink droplets 1060R and 1060G, which are likely to cause color mixture, is set greater than the interval between ink droplets 1060G and 1060B. This configuration prevents contact between at least the ink droplets 1060R and 1060G, and prevents the occurrence of color mixture.

After applying the ink droplets, baking is performed to dry the ink droplets.

The method for forming the organic light-emitting layers is not limited to the above-described method, and any known method such as the dispenser method, nozzle coat method, spin coat method, intaglio printing, or letterpress printing may be used for dripping or applying ink.

The organic light-emitting layers 106R, 106G and 106B are thus formed appropriately (section (a) of FIG. 9)

Subsequently, the electron injection layer 107 and the cathode 108 are sequentially formed on the entire surfaces of the organic light-emitting layers and the banks by, for example, vacuum deposition method (section (b) of FIG. 9).

Subsequently, the passivation layer 109 is formed on the upper surface of the cathode 108 (section (c) of FIG. 9). This completes the display panel 10.

The following explains Embodiment 2 of the present invention, mainly about the differences from Embodiment 1.

<Second Embodiment>

Figure 10:
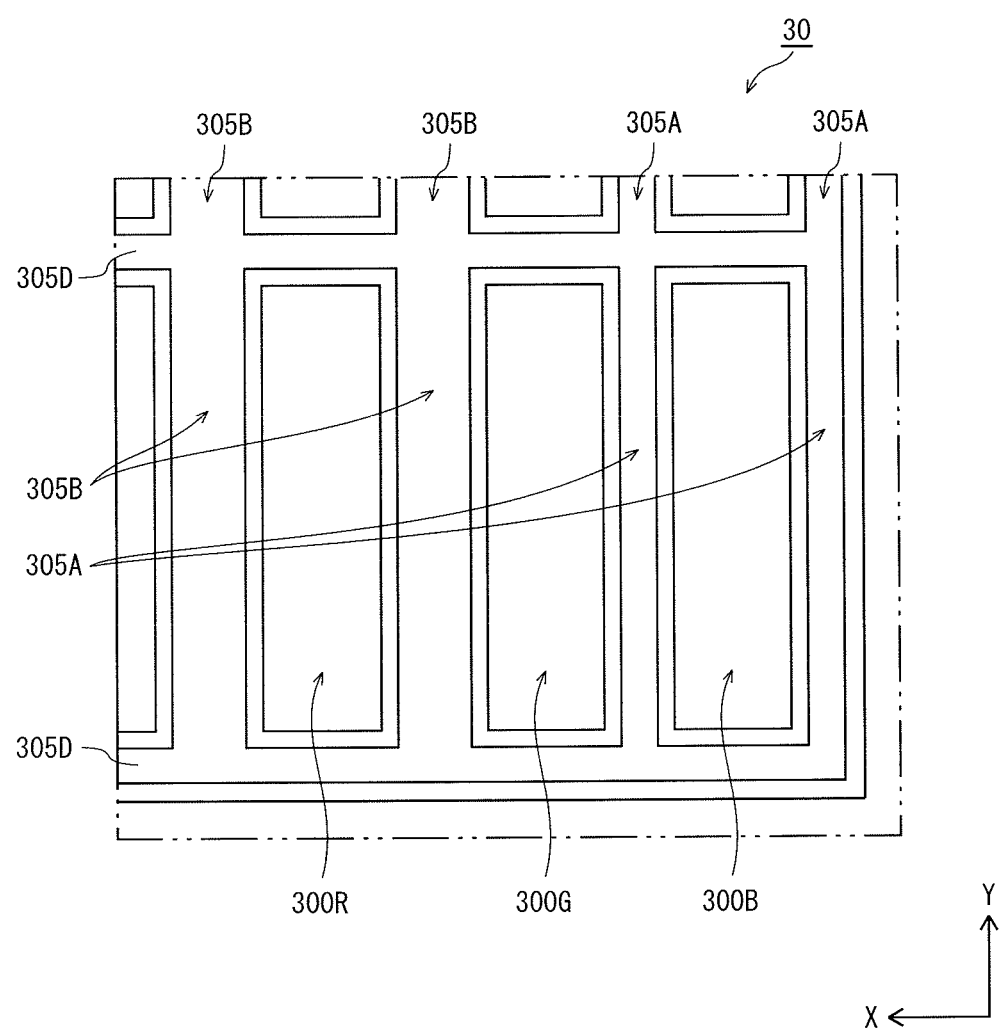
FIG. 10 is a partially enlarged view illustrating arrangement of organic EL elements in a display panel 30 having a pixel bank structure.
Figure 11:
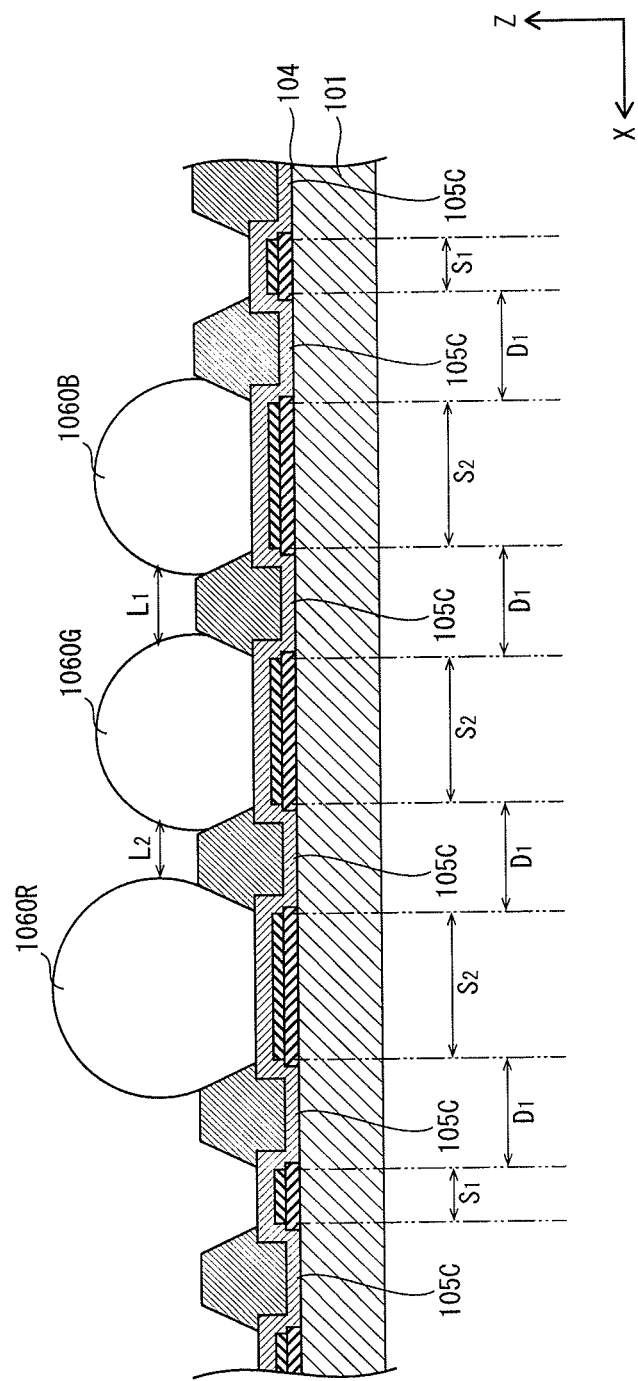
FIG. 11 is a cross-sectional view illustrating a stage in a manufacturing process of a conventional display panel (immediately after application of ink).

FIG. 10 is a panel frontal view showing the configuration of a display panel 30 pertaining to Embodiment 2.

The overall configuration of the display panel 30 is the same as the display panel 10. The difference is that pixel banks are provided to surround each of the elements 300R, 300G and 300B. The pixel banks include first banks (305B), second banks (305A) and third banks (305D). Among these, the banks 305B provided at both ends of the element 300R in the X direction are formed wider than the banks 305A and 305D. Although the widths of the banks 305A and 305D may be the same or different, it is preferable that they are smaller than the banks 305B in order to design all the banks with consideration of margins.

The display panel 30 with this configuration achieves almost the same advantageous effects as the display panel 10.

That is, during the manufacturing process, the stated configuration prevents color mixture at both ends of particularly the banks 305B in the X axis direction, and allows for proper formation of the organic light-emitting layers. Furthermore, since only the banks 305B are formed to have a wide width, the stated configuration prevents the decrease in aperture ratio of the light-emitting areas and the bus bar areas, and achieves the display panel 30 with desirable light-emitting characteristics.

<Other Considerations>

In the display panel 10, the anodes 102 are disposed below the organic light-emitting layer 106G and the cathodes 108 are disposed above the organic light-emitting layer 106G. However, this configuration is not essential. For example, the cathodes 108 may be disposed below the organic light-emitting layer 106G and the anode 102 may be disposed above the organic light-emitting layer 106G. When such a configuration is adopted in a top-emission type panel, the cathodes 108 need to be configured as a reflective electrode layer, and the anodes 102 need to be configured as a transparent electrode layer.

The material for the hole transport layer may be either a high molecular material or a low molecular material, and the hole transport layer may be formed by wet printing, for example. When forming the organic light-emitting layer, which is the uppermost layer, it is desirable for the material for the hole transport layer to include a cross-linking agent so as not to mix with the material for the organic light-emitting layer. Examples of the material for the hole transport layer are a copolymer that includes a fluorene region and a triarylamine region, and a triarylamine derivative with a low molecular weight. An example of a cross-linking agent is dipentaerythritol hexaacrylate. In this case, it is desirable that the cross-linking agent be formed from poly(3, 4-ethylenedioxythiophene) doped with polystyrene sulfonic acid (PEDOT: PSS) or a derivative thereof (a copolymer or the like).

A hole transport layer may be provided between the hole injection layer and the organic light-emitting layer. The hole transport layer has the function of transporting holes injected from the hole injection layer to the organic light-emitting layer. An organic material with hole transporting properties is used as the hole transport layer. The organic material for the hole transport layer is an organic substance having the property of conducting holes via an intermolecular charge-transfer reaction. This is also known as a p-type organic semiconductor.

According to Embodiments 1 and 2 described above, the organic light-emitting layers corresponding to luminescent colors of R, G and B are formed. However, organic light-emitting layers corresponding to other luminescent colors may be formed.

In Embodiments above, the banks 105B located at both ends in the X direction of the first organic light-emitting layer (106R corresponding to red in the examples described above) are formed to have a wide width. However, this is not essential, and the color mixture problem can be prevented when at least the second organic light-emitting layer (106G corresponding to green in the examples described above) is formed to have a wide width. When it is desired to prevent overflow of the ink droplet 1060R into the bus bar areas 100X, it is desirable to form the banks 105B located at both ends in the X direction of the organic light-emitting layer 106R to have a wide width.

INDUSTRIAL APPLICABILITY

An organic EL panel pertaining to the present invention is applicable to, for example, a display for mobile telephones, a display device such as a television and various sorts of light sources. Regardless of the specific use thereof, the organic EL display panel can be used as an organic EL display panel driven at a low voltage while exhibiting a wide range of luminous intensity, from low luminous intensity to high luminous intensity. With such high performance, the organic EL element of is usable for a variety of purposes, for example, in various types of display apparatuses at home, public facilities, and working places, television apparatuses, displays for mobile electronic equipment, and light sources.

REFERENCE SIGNS LIST $D_1, D_2, D_3$ Width of bank
$S_1, S_2, S_3$ Width of light-emitting area
$L_1, L_2, L_3$ Interval between ink droplets
1 Organic EL apparatus
10, 30 Display panel (Organic EL panel)
20 Drive controller
21-24 Drive circuit
25 Control circuit
100R, 100G, 100B, 300R, 300G, 300B Organic EL element
100X Bus bar area
101 Substrate
102 Anode (First electrode)
102B Auxiliary electrode (Bus bar)
103, 103B Electrode coating layer
104 Hole injection layer
105A, 105B, 105C, 305A, 305B, 305D Bank
106R, 106G, 106B Organic light-emitting layer
107 Electron injection layer
108 Cathode (Second electrode)
109 Passivation layer
501 Exposure mask
502 Aperture
1050 Bank material layer
1060R, 1060G, 1060B Ink containing organic light-emitting material

The invention claimed is:

1. An organic EL panel, comprising:
a substrate;
an array of first electrodes, the first electrodes being arranged above the substrate along a first direction and a second direction intersecting with each other, and the array being composed of rows each extending along the first direction;
a first organic light-emitting layer, a second organic light-emitting layer, and a third organic light-emitting layer arranged above the array of first electrodes so as to be parallel to each other along the first direction, and each containing an organic light-emitting material corresponding to a different emission color;
a pair of first banks formed along the first direction at either side of the first organic light-emitting layer;
a second bank formed between the second organic light-emitting layer and the third organic light-emitting layer; and
a second electrode disposed above the first organic light-emitting layer, the second organic light-emitting layer, and the third organic light-emitting layer, and being different in polarity from the array of first electrodes, wherein
each of the pair of first banks is the same in width along the second direction, and is greater in width along the second direction than the second bank, and
the first organic light-emitting layer, the second organic light-emitting layer, and the third organic light-emitting layer are the same in width along the second direction.

2. The organic EL panel of claim 1, wherein the first organic light-emitting layer is a red light-emitting layer.

3. The organic EL panel of claim 1, further comprising
a third bank extending along the second direction and separating first electrodes included in each row of the array of first electrodes from each other.

4. An organic EL panel, comprising:
a substrate;
an array of first electrodes, the first electrodes being arranged above the substrate along a first direction and a second direction intersecting with each other, and the array being composed of rows each extending along the first direction;
a first organic light-emitting layer, a second organic light-emitting layer, and a third organic light-emitting layer arranged above the array of first electrodes so as to be parallel to each other along the first direction, and each containing an organic light-emitting material corresponding to a different emission color;
a pair of first banks formed along the first direction at either side of the first organic light-emitting layer;
a second bank formed between the second organic light-emitting layer and the third organic light-emitting layer; and
a second electrode disposed above the first organic light-emitting layer, the second organic light-emitting layer, and the third organic light-emitting layer, and being different in polarity from the array of first electrodes, wherein
each of the pair of first banks is the same in width along the second direction, and is greater in width along the second direction than the second bank,
each of the first organic light-emitting layer, the second organic light-emitting layer, and the third organic light-emitting layer is a dried coating of ink containing an organic light-emitting material, and
the ink for the first organic light-emitting layer has a lower density than the ink for the second organic light-emitting layer and the ink for the third organic light-emitting layer.

5. An organic EL panel, comprising:
a substrate;
an array of first electrodes, the first electrodes being arranged above the substrate along a first direction and a second direction intersecting with each other, and the array being composed of rows each extending along the first direction;
a first organic light-emitting layer, a second organic light-emitting layer, and a third organic light-emitting layer arranged above the array of first electrodes so as to be parallel to each other along the first direction, and each containing an organic light-emitting material corresponding to a different emission color;
a pair of first banks formed along the first direction at either side of the first organic light-emitting layer;
a second bank formed between the second organic light-emitting layer and the third organic light-emitting layer; and
a second electrode disposed above the first organic light-emitting layer, the second organic light-emitting layer, and the third organic light-emitting layer, and being different in polarity from the array of first electrodes, wherein
each of the pair of first banks is the same in width along the second direction, and is greater in width along the second direction than the second bank,
each of the first organic light-emitting layer, the second organic light-emitting layer, and the third organic light-emitting layer is a dried coating of ink containing an organic light-emitting material, and
the ink for the second organic light-emitting layer has a higher density than the ink for the first organic light-emitting layer and the ink for the third organic light-emitting layer.

6. An organic EL panel, comprising:
a substrate;
an array of first electrodes, the first electrodes being arranged above the substrate along a first direction and a second direction intersecting with each other, and the array being composed of rows each extending along the first direction;
a first organic light-emitting layer, a second organic light-emitting layer and a third organic light-emitting layer arranged above the array of first electrodes so as to be parallel to each other along the first direction, and each containing an organic light-emitting material corresponding to a different emission color;
a pair of first banks formed along the first direction at either side of the first organic light-emitting layer;
a second bank formed between the second organic light-emitting layer and the third organic light-emitting layer; and
a second electrode disposed above the first organic light-emitting layer, the second organic light-emitting layer, and the third organic light-emitting layer, and being different in polarity from the array of first electrodes, wherein
the pair of first banks and the second bank are provided in a plurality of sets, and, in at least one of the plurality of sets, each of the pair of first banks is the same in width along the second direction and is greater in width along the second direction than the second bank, and
the first organic light-emitting layer, the second organic light-emitting layer, and the third organic light-emitting layer are the same in width along the second direction.

7. A method for manufacturing an organic EL panel, comprising:
preparing a substrate;
forming an array of first electrodes above the substrate, the first electrodes being arranged along a first direction and a second direction intersecting with each other, and the array being composed of rows each extending along the first direction;
forming a plurality of banks above the substrate;
forming a first organic light-emitting layer, a second organic light-emitting layer, and a third organic light-emitting layer in parallel with each other along the first direction above the array of first electrodes after the forming of the plurality of banks, each of the first organic light-emitting layer, the second organic light-emitting layer and the third organic light-emitting layer containing an organic light-emitting material corresponding to a different emission color; and
forming a second electrode above the first organic light-emitting layer, the second organic light-emitting layer and the third organic light-emitting layer, the second electrode being different in polarity from the array of first electrodes, wherein
in the forming of the plurality of banks, a pair of first banks is formed along the first direction at either side of the first organic light-emitting layer, and a second bank is formed along the first direction between the second organic light-emitting layer and the third organic light-emitting layer, the pair of first banks being the same in width along the second direction, and the second bank being smaller than the pair of first banks in width along the second direction, and the first organic light-emitting layer, the second organic light-emitting layer, and the third organic light-emitting layer are the same in width along the second direction.

8. The method of claim 7, wherein each of the first organic light-emitting layer, the second organic light-emitting layer and the third organic light-emitting layer is formed by applying ink containing the organic light-emitting material above the array of first electrodes, and drying the ink.

9. The method of claim 8, wherein each of the pair of first banks is formed to be greater in width along the second direction than the second bank, and the ink for the first organic light-emitting layer has a lower density than ink for the second organic light-emitting layer and the ink for the third organic light-emitting layer.

10. The method of claim 8, wherein each of the pair of first banks is formed to be greater in width along the second direction than the second bank, and the ink for the second organic light-emitting layer has a higher density than the ink for the first organic light-emitting layer and the ink for the third organic light-emitting layer.

* * * * *